US006932885B1

(12) United States Patent
Oka (10) Patent No.: US 6,932,885 B1
(45) Date of Patent: Aug. 23, 2005

(54) VACUUM PROCESSING DEVICE (75) Inventor: Hiroki Oka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 288 days.

(21) Appl. No.: 10/070,902

(22) PCT Filed: Sep. 12, 2000

(86) PCT No.: PCT/JP00/06219

§ 371 (c)(1),
(2), (4) Date: Jun. 26, 2002

(87) PCT Pub. No.: WO01/20663

PCT Pub. Date: Mar. 22, 2001

(30) Foreign Application Priority Data

Sep. 13, 1999 (JP) ............................................ 11/258690

(51) Int. Cl.[7] ............................. H01L 21/68; B01J 3/00
(52) U.S. Cl. .................................. 156/345.55; 118/730
(58) Field of Search ....................... 118/730; 156/345.55

(56) References Cited

FOREIGN PATENT DOCUMENTS

| JP | 05332456 A | * | 12/1993 | .......... F16J/15/447 |
| JP | 07231028 A | * | 8/1995 | .......... H01L/21/68 |
| JP | 11214489 A | * | 8/1999 | .......... H01L/21/68 |

* cited by examiner

Primary Examiner—Gregory Mills
Assistant Examiner—Sylvia R. MacArthur
(74) Attorney, Agent, or Firm—Finnegan, Henderson, Farabow, Garrett & Dunner, LLP (57) ABSTRACT A vacuum processing device includes a driven body 122 provided inside a vacuum processing chamber 104, a driving means 126 provided outside the vacuum processing chamber 104 and a drive shaft 124 connecting the driven body 122 to the driving means 126. A first annular body 152 is secured to the drive shaft 124 and a second annular body 150 is rotatably supported by the first annular body 152. A bellows 148 that airtightly seals the periphery of the drive shaft 124 is provided so as to connect the second annular body 150 with the inner wall of the vacuum processing chamber 104. In this structure, the bellows 148 is allowed to move as one body with the drive shaft 124 during vertical motion of the drive shaft 124 but is made to stay in place during rotational motion of the drive shaft 124. Thus, the drive shaft, which engages in vertical motion and rotational motion, is airtightly sealed by the bellows.

10 Claims, 4 Drawing Sheets

VACUUM PROCESSING DEVICE

TECHNICAL FIELD

The present invention relates to a vacuum processing device.

BACKGROUND ART

A multichamber type processing device adopting the so-called cluster structure is employed in the process of manufacturing semiconductor devices, LCD substrates and the like in the related art. A multichamber type processing device normally includes a vacuum transfer chamber, a plurality of vacuum processing chambers provided around the vacuum transfer chamber and a vacuum cassette chamber. In this structure, workpieces housed inside a cassette placed within the vacuum cassette chamber are sequentially transferred into the individual vacuum processing chambers by a transfer arm provided in the vacuum transfer chamber to allow various types of processing such as etching to be implemented continuously. In addition, the atmosphere within the vacuum transfer chamber in the processing device is sustained at a reduced pressure. This makes it possible to first deliver the cassette from the atmosphere side into the vacuum cassette chamber, reduce the atmosphere inside the vacuum cassette chamber to a level substantially equal to the level of the pressure inside the vacuum transfer chamber and then transfer the workpieces from the cassette into the vacuum transfer chamber.

Now, the structure assumed in a standard vacuum cassette chamber 10 that may be provided in the processing device described above is explained in reference to FIG. 4. As illustrated in the figure, a cassette stage 16 on which a cassette 12 is set is supported by a drive shaft 14 in the vacuum cassette chamber 10, and the stage 16 is driven to move up/down and rotate freely by a drive mechanism (not shown). By adopting this structure, it is possible to adjust the orientation of the cassette 12 on the stage 16 as necessary and to move workpieces 24 set over multiple stages within the cassette 12 up and down to adjust their heights to the position at which they are transferred to the transfer arm (not shown).

Figure 4:
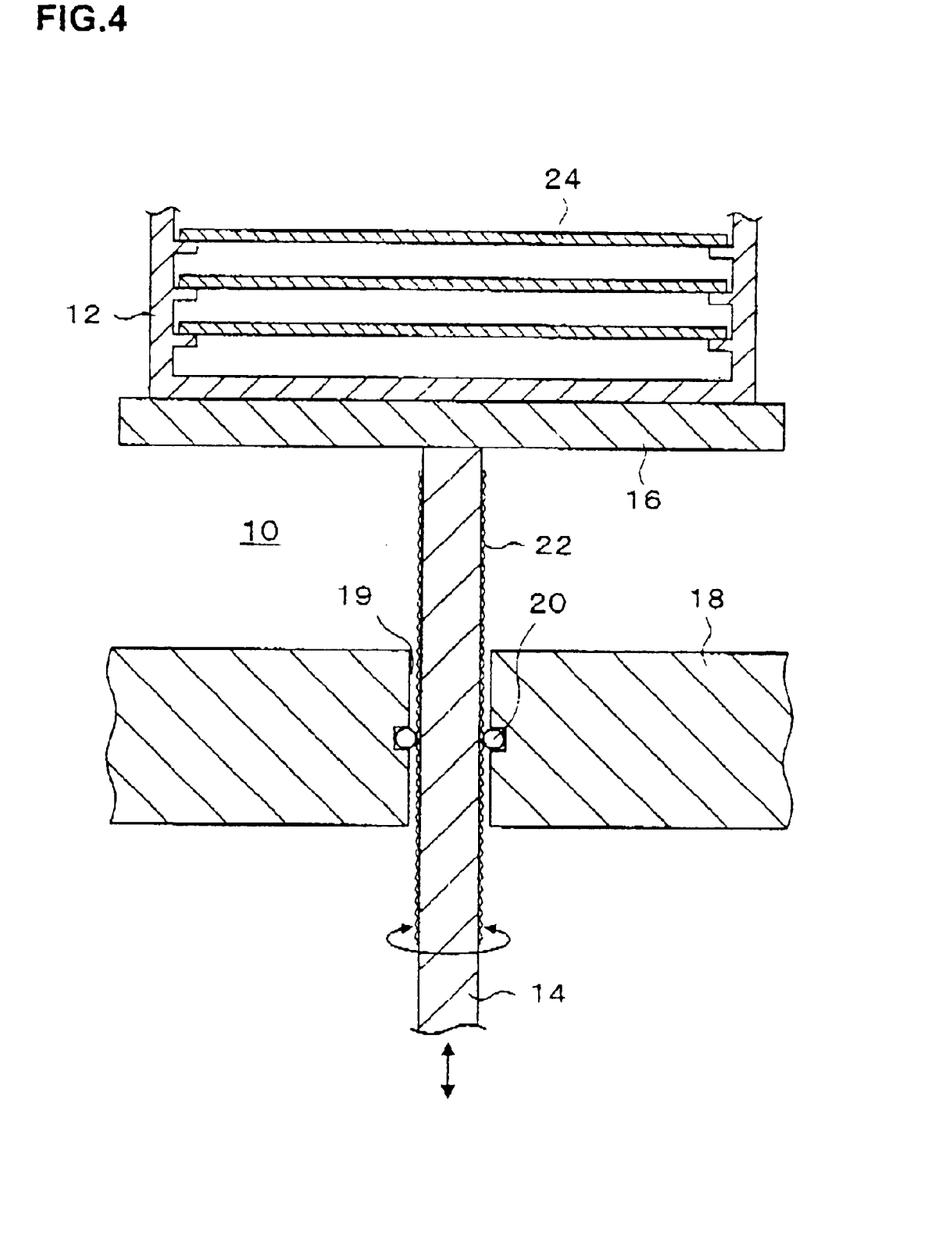
FIG. 4 is a schematic sectional view of a seal mechanism employed to seal a vacuum cassette chamber in the related art.

The drive mechanism that drives the elevator shaft 14 is provided outside the vacuum cassette chamber 10. Thus, the drive shaft 14 passes through a through hole 19 formed at a vacuum container 18 enclosing the vacuum cassette chamber 10 and connects the drive mechanism and the stage 16. Between the drive shaft 14 and the inner wall of the through hole 19, a slight gap is formed to ensure that the vertical motion and the rotational motion of the drive shaft 14 are not hindered, and an O-ring 20 is provided at this gap. The O-ring 20, constituted of an elastic material, is provided in complete contact with the drive shaft 14 and the inner wall of the through hole 19, and thus, the gap between the drive shaft 14 and the inner wall of the through hole 19 is sealed without hindering the vertical or rotational motion of the drive shaft 14. This structure ensures that the presence of the drive shaft 14 extending through the vacuum cassette chamber 10 and outside of the vacuum cassette chamber 10 does not compromise the airtightness of the vacuum cassette chamber 10. In addition, a lubricant 22 is applied onto the contact surface where the drive shaft 14 and the O-ring 20 achieve contact with each other, thereby reducing the force caused by the friction between the drive shaft 14 and the O-ring 20.

However, there is a problem in that if a large area of the drive shaft 14 is exposed into the vacuum cassette chamber 10, the lubricant 22 applied onto the surface of the drive shaft 14 may cause contamination of the workpieces 24. In addition, the lubricant 22 becomes worn faster as the vacuum cassette chamber 10 is evacuated, resulting in an increase in the frictional force between the drive shaft 14 and the O-ring 20.

An object of the present invention, which has been completed by addressing the problems of the related art discussed above, is to provide a new and improved vacuum processing device capable of solving the problems discussed above and other problems as well.

DISCLOSURE OF THE INVENTION

In order to achieve the object described above, in a first aspect of the present invention, a vacuum processing device comprising a driven body provided within a vacuum processing chamber, a driving means provided outside the vacuum processing chamber and a drive shaft connecting the driven body to the driving means to transmit a drive force of the driving means to the driven body, which further includes a first annular body secured to the drive shaft inside the vacuum processing chamber, a second annular body rotatably supported by the first annular body and a bellows that connects the second annular body to the inner wall of the vacuum processing chamber so as to airtightly seal the periphery of the drive shaft and is allowed to expand/contract freely as the drive shaft moves up/down is provided.

It is to be noted that the functions required of the first annular body according to the present invention are that it is capable of rotating and moving up/down united with the drive shaft and that it is capable of rotatable supporting the second annular body. It may adopt any of various shapes and dimensions. For instance, while the term "annular body" is used in this description, it is not strictly necessary for it to completely enclose the drive shaft by adopting a completely annular shape, and it may be constituted of a plurality of blocks or it may adopt a sleeve shape.

Likewise, the functions required of the second annular body are that it is capable of moving up/down supported by the first annular body (the drive shaft) without rotating and that it allows one end of the bellows to be secured to it. It may adopt any of various shapes and dimensions. For instance, while the term "annular body" is used in this description, it is not strictly necessary for it to completely enclose the drive shaft by adopting a completely annular shape, and it may be constituted of a plurality of blocks or it may adopt a sleeve shape.

In this structure, by allowing the first annular body to rotate relative to the second annular body while the drive shaft is rotating, the bellows can be effectively prevented from becoming twisted or the like. By allowing the first annular body and the second annular body to move as one body while the drive shaft moves up/down, the bellows are allowed to expand/contract smoothly. In addition, since the driving portion of the drive shaft is mostly sealed by the bellows, the amount of contamination which leaks from the drive shaft into the vacuum container is minimized to achieve an improvement in the yield of wafers. Furthermore, the size of the surface area of the drive shaft having the lubricant applied thereto exposed into the vacuum container is minimized, which makes it possible to minimize contamination caused by the lubricant as well.

By adopting a structure in the first annular body and the second annular body in which they achieve a male/female fit by, for instance, fitting a projecting portion of the second annular body into a groove formed around the first annular body, the structure enables the second annular body to rotate around the first annular body with case.

By, configuring the second annular body so as to enclose the drive shaft via a first seal member such as an O-ring that allows movement of the drive shaft, a double seal mechanism is achieved to increase the degree of airtightness in the space enclosed bad the bellow. It is desirable that the drive shaft passes through the inner wall of the vacuum processing chamber via a second seal member such as an O-ring which allows movement of the drive shaft while achieving airtightness.

According to the present invention, which is ideal in an application in a vacuum processing device having a driving means capable of rotating and raising/lowering the driven body via a drive shaft, a high degree of airtightness is maintained even during such rotational and vertical motion.

It is desirable that a means for pressure adjustment which adjusts the pressure in the space airtightly sealed by the bellows be provided in the vacuum processing device according to the present invention, and by providing such a means for pressure adjustment, it becomes possible to sustain the levels of the pressure in the space airtightly sealed by the bellows and the pressure inside the vacuum processing chamber substantially equal to each other, thereby preventing any leakage of contaminants from the space sealed by the bellows into the vacuum processing chamber and also preventing any damage to the bellows itself caused by twisting or the like.

In order to achieve the object described above, in a second aspect of the present invention, a vacuum processing device comprising a driven body provided within a vacuum processing chamber, a driving means provided outside the vacuum processing chamber and a drive shaft connecting the driven body to the driving means to transmit a drive force of the driving means to the driven body, which further includes a rotating body through which the drive shaft passes, rotationally supported at an opening formed at a wall of the vacuum processing chamber, and a bellows that connects the driven body to the rotating body so as to airtightly seal the periphery of the drive shaft and is allowed to expand/contract freely as the drive shaft moves up/down, is provided.

In this structure, by allowing the rotating body to rotate relative to the opening at the wall of the vacuum processing chamber while the drive shaft rotates, twisting or the like of the bellows can be prevented effectively. By allowing the drive shaft to move relative to the rotating body while the drive shaft moves up/down, the bellows is allowed to expand/contract smoothly. In addition, since the entirety of the drive shaft is sealed by the bellows, the leakage of contaminants from the drive shaft into the vacuum container is minimized to achieve an improvement in the yield of wafers. Furthermore, since no surface of the drive shaft having the lubricant applied thereto is exposed into the vacuum container, the extent of contamination attributable to the lubricant can be minimized as well.

It is desirable that the rotating body be airtightly supported at the opening via a first seal member which allows rotation of the rotating body in the vacuum processing device described above. In addition, by allowing the rotating body and the opening to achieve a male/female fit with, for instance, a projecting portion at the opening fitted at a groove formed around the rotating body, a structure that allows the rotating body to rotate relative to the opening can be realized with ease. It is desirable that the rotating body be provided so as to airtightly enclose the drive shaft via a second seal member which allows movement of the drive shaft.

By providing an auxiliary shaft which passes through the rotating body and supports the rotating boded while rotating in response to a rotation of the driven body, located at a position offset from the position of the drive shaft, the load applied to the bellows during the rotation can be reduced to prevent damage to the bellows caused by bending or the like. It is desirable that this auxiliary shaft airtightly pass through the rotating body via a third seal member which allows movement of the auxiliary shaft so that the presence of the auxiliary shaft does not hinder the vertical motion of the drive shaft.

In the second aspect of the present invention, which is also ideal in an application in a vacuum processing device having a driving means capable of rotating and raising/lowering the driven body via a drive shaft, a high degree of airtightness is maintained even during such rotational and vertical motion.

It is desirable that a means for pressure adjustment which adjusts the pressure in the space airtightly sealed by the bellows be provided in the vacuum processing device according to the present invention, and by providing such a means for pressure adjustment, it becomes possible to sustain the levels of the pressure in the space airtightly sealed by the bellows and the pressure inside the vacuum processing chamber substantially equal to each other, thereby preventing any leakage of contaminants from the space sealed by the bellows into the vacuum processing chamber and also preventing any damage to the bellows itself caused by twisting or the like.

BEST MODE FOR CARRYING OUT THE INVENTION

The following is a detailed explanation of preferred embodiments in which the vacuum processing device according to the present invention is adopted in a multi-chamber type processing device, given in reference to the attached drawings.

(First Embodiment)
(1) Overall Structure of the Processing Device

Figure 1:
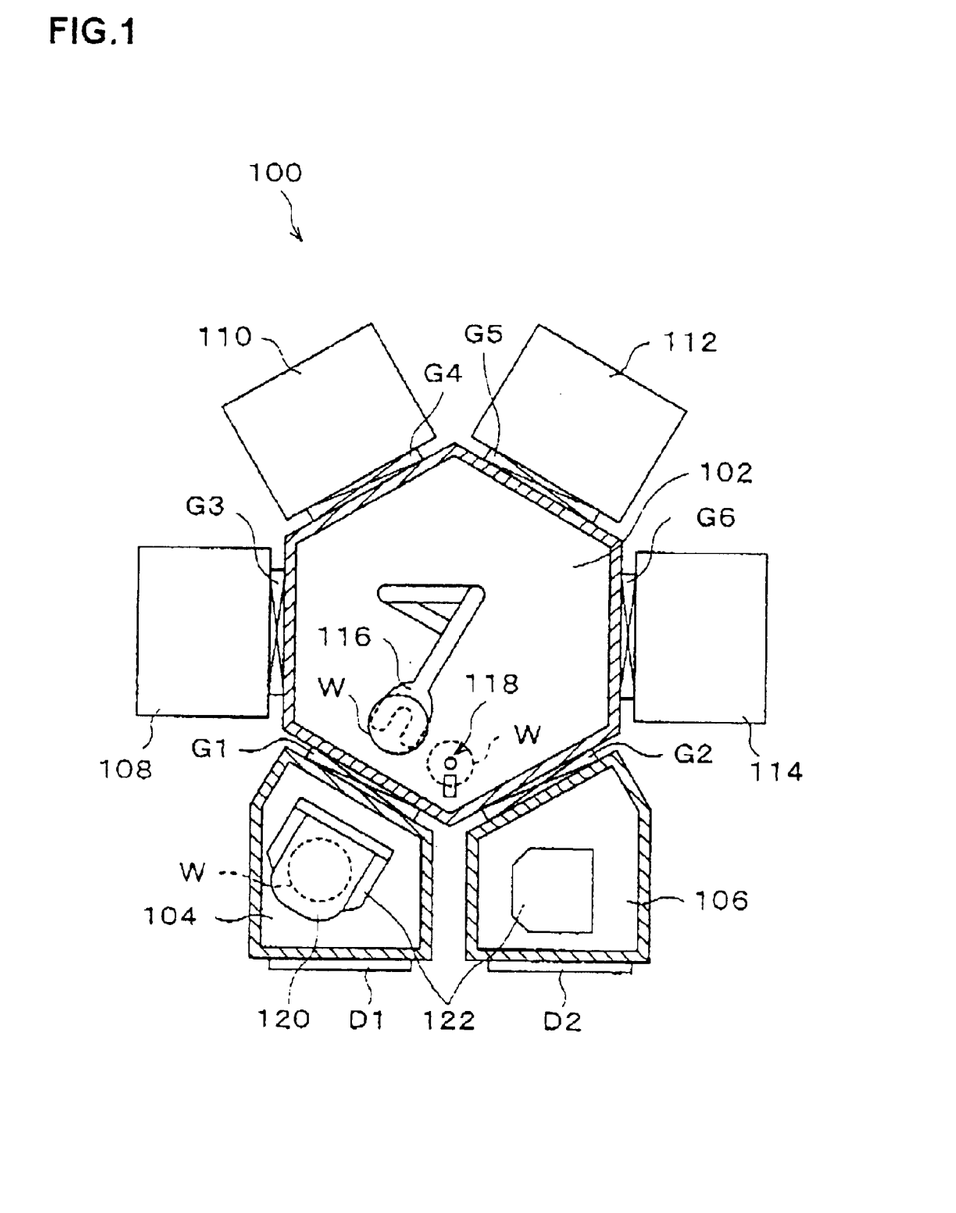
FIG. 1 is a schematic sectional view of a processing device having vacuum cassette chambers in which the present invention may be adopted.

First, in reference to FIG. 1, the structure of a processing device 100 is briefly explained. First and second vacuum cassette chambers 104 and 106 in conjunction with which the present invention may be adopted and first–fourth vacuum processing chambers 108, 110, 112 and 114 are provided around a vacuum transfer chamber 102. The first and second vacuum cassette chambers 104 and 106 and the first–fourth vacuum processing chambers 108, 110, 112 and 114 are connected to the vacuum transfer chamber 102 respectively via first–sixth gate valves G0–G6 that can be opened/closed to form a seal. Atmosphere-side openings of the first and second vacuum cassette chambers 104 and 106 are sealed by first and second door valves D1 and D2, which can be opened/closed freely. Inside the vacuum transfer chamber 102, a transfer arm 116 that delivers workpieces such as semiconductor wafers (hereafter referred to as "wafers") W is provided. An orienter 118 that aligns the wafers W is also provided inside the vacuum transfer chamber 102.

(2) Structures of First and Second Vacuum Cassette Chambers

Figure 2:
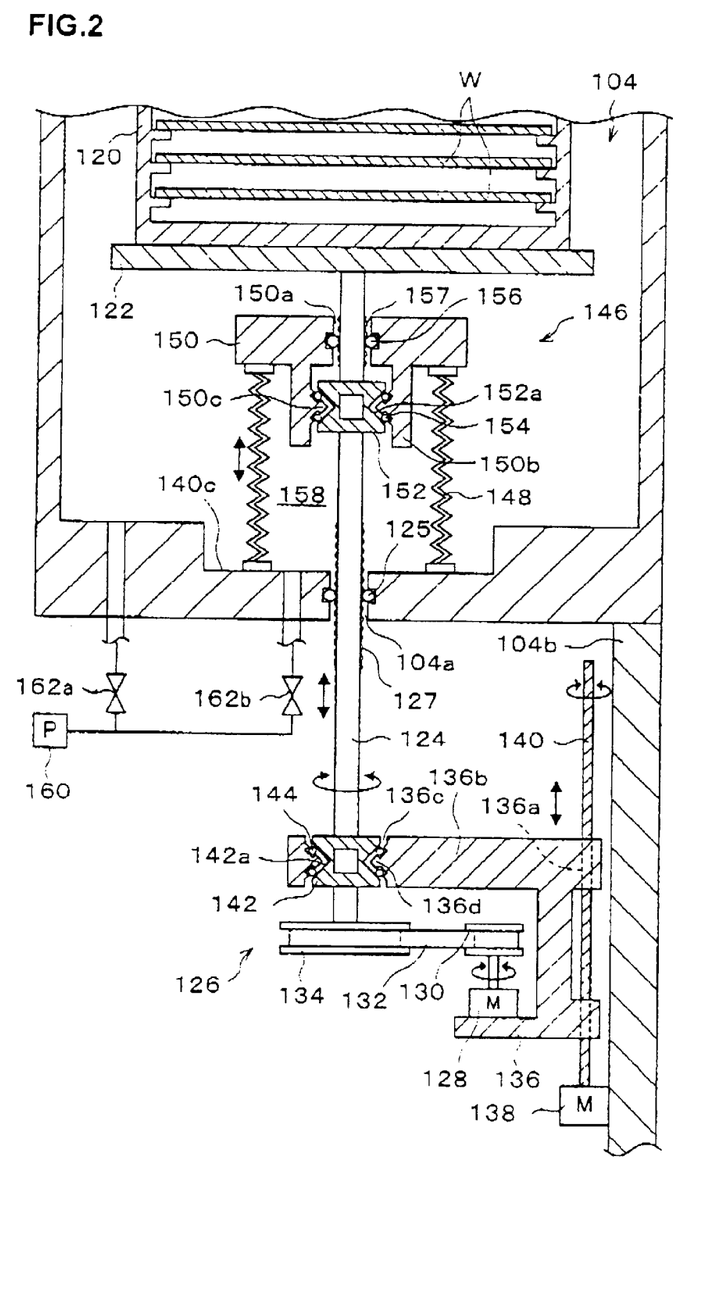
FIG. 2 is a schematic sectional view of the seal mechanism employed to seal the vacuum cassette chambers shoved in FIG. 1 and the drive mechanism employed to drive the stage.

Next, in reference to FIGS. 1 and 2, the structures of the first and second vacuum cassette chambers 104 and 106 constituting the vacuum processing device in the embodiment are explained. It is to be noted that since the first and second vacuum cassette chambers 104 and 106 adopt structures essentially identical to each other, an explanation is given by referring to the first vacuum cassette chamber 104 as an example. As shown in FIGS. 1 and 2, a cassette stage (hereafter simply referred to as a stage) 122 constituting the driven body in the embodiment is provided inside the first vacuum cassette chamber 104. On the stage 122, a cassette 120 capable of housing a plurality of wafers e.g., 25 wafers W, can be placed.

As shown in FIG. 2, one end of a drive shaft 124 is connected to the stage 122 so as to allow the stage 122 to rotate and move up/down. The drive shaft 124 passes through a through hole 104a formed at the bottom 104c of the first vacuum cassette chamber 104 and extends to the outside of the first vacuum cassette chamber 104. A seal member such as an O-ring 125 and a bearing may be provided between the drive shaft 124 and the through hole 104a. The O-ring 125 which is constituted of an elastic material with a low coefficient of friction such as rubber or resin achieves complete contact with the drive shaft 124 and the inner wall of the through hole 104a with airtightness while allowing rotational and vertical motion of the drive shaft 124. A lubricant 127 is applied onto the contact surface of the drive shaft 124 where the drive shaft 124 comes in contact with the O-ring 125, and the lubricant 127 reduces the frictional force between the drive shaft 124 and the inner wall of the through hole 104a to allow smoother rotational and vertical motion of the drive shaft 124 and ultimately to sustain the airtightness inside a bellows internal space 158 which is to be detailed later.

A drive mechanism 126 is provided at the other end of the drive shaft 124 on the outside of the first vacuum cassette chamber 104. The drive mechanism 126 includes a first motor M128 for driving the drive shaft 124 rotationally and a second motor M138 for driving the drive shaft 124 vertically.

The second motor M138 for vertical drive is mounted at a post 104b of the first vacuum cassette chamber 104 and is capable of rotating a rotating shaft 140. The rotating shaft 140 adopts a screw-shaft structure and is interlocked at a through hole 136a achieving a nut structure having a thread groove defined therein. The through hole 136a is provided at a supporting base 136. The rotating shaft 140 and the through hole 136a together achieve the so-called ball screw structure which allows the supporting base 136 to move up/down as the rotating shaft 140 rotates. The drive shaft 124 is rotatably supported at the supporting base 136 and thus, the drive shaft 124 can be moved up/down as the supporting base 136 travels up/down.

A more detailed explanation is now given on the support structure through which the drive shaft 124 is supported by the supporting base 136. An annular body 142 having a groove 142a defined around it is secured at a position toward the bottom of the drive shaft 124. In addition, a projecting portion 136d is formed at the inner surface of an opening 136c formed at a distended portion 136b, in correspondence to the groove 142a mentioned above. The drive shaft 124 can be rotatably supported by fitting the projecting portion 136d at the inner surface of the opening 136c into the groove 142a of the annular body 142. A bearing 144 is provided between the groove 142a and the projecting portion 136d so as to allow the drive shaft 124 to rotate smoothly. It is to be noted that modifications may be made in design with regard to which member should include a male (projecting) portion and which member should include a female (groove) portion, as long as a male/female fit is achieved between the opening 136c and the annular body 142.

As explained above, the nut portion of the ball screw structure and the supporting structure for supporting the drive shaft 124 are achieved as an integrated unit in the embodiment and, as a result, the vertical accuracy of the vertical motion of the drive shaft 124 is improved.

In addition, the structure achieved in the embodiment includes the first motor M128 mounted at the supporting base 136 to drive the drive shaft 124 rotationally. The first motor M128 is connected to the drive shaft 124 via a first pulley 130, a rotating belt 132 and a second pulley 134. By adopting this structure, it becomes possible to rotate the drive shaft 124 pith the first motor M128 and ultimately to rotate the stage 122 supported by the drive shaft 124 and the cassette 120. The drive shaft 124, which is rotatably supported at the distended portion 136b of the supporting base 136, is able to rotate in a stable manner with a high degree of accuracy.

The portion of the drive shaft 124 extending inside the first vacuum cassette chamber 104 is airtightly enclosed by a seal mechanism (means for sealing) 146 to be detailed later. The structure of the seal mechanism 146 is to be described in detail below.

(3) Operation of Processing Device

Next, in reference to FIG. 1, the operation of the processing device 100 is explained. It is to be noted that the explanation is given on an operation during which the wafers W are transferred from the first vacuum cassette chamber 104. First, the first door valve D1 is opened and the cassette 120 housing therein the wafers W is placed on the stage 122 inside the first vacuum cassette chamber 104. After closing the first door valve D1, the first vacuum cassette chamber 104 is evacuated in order to reduce the pressure inside the first vacuum cassette chamber 104 to a level essentially equal to that in the vacuum transfer chamber 102. At the same time, the cassette 120 is caused to rotate and move up/down as appropriate via the stage 122 in order to orient the cassette 120 along the correct direction in which the wafers W are transferred. Then, the gate valve G1 is opened.

Next, the cassette 120 is moved up/down to adjust the vertical position of wafers W to the transfer position of the transfer arm 116, and thus, the wafers W in the cassette 120 are sequentially transferred into the first–fourth vacuum processing chambers 108, 110, 112 and 114 by the transfer arm 116 to undergo various types of processing such as etching and film formation. The processed wafers W are returned into the cassette 120. When all the wafers W are returned to the cassette 120, the gate valve G1 is closed. Next, the cassette 120 is caused to rotate via the stage 122 toward the direction in which cassette 120 is taken out of the processing device 100. Concurrently, an inert gas, for instance, is supplied into the first vacuum cassette chamber 104 to raise the pressure inside the first vacuum cassette chamber 104 to a level approximately equal to the level of the atmospheric pressure. Then, the door valve D1 is opened to take the cassette 120 to the outside.

(4) Structure of Seal Mechanism

Now, in reference to FIG. 2, the seal mechanism 146 constituting the core of the present invention is described in detail in conjunction with the first vacuum cassette chamber 104. As explained earlier, the portion of the drive shaft 124 extending inside the first vacuum cassette chamber 104 is covered by the seal mechanism 146.

The seal mechanism 146 includes a first annular body 152 secured to the drive shaft 124, a second annular body 150 which is rotatably supported by the first annular body 152 and a bellows 148 capable of expanding/contracting as the drive shaft 124 travels up/down.

The bellows 148, which may be constituted of, for instance, a stainless steel airtight material adopting an accordion-like form and having a 40 mm inner diameter and a 70 mm outer diameter, is capable of airtightly sealing the periphery of the drive shaft 124 with a 30 mm diameter in the first vacuum cassette chamber 104 with airtightness. The two ends of the bellows 148 are respectively connected to the bottom 104c of the first vacuum cassette chamber 104 and the second annular body 150.

The second annular body 150, which supports the bellows 148 from the top may be constituted of, for instance, an aluminum material formed in a roughly annular shape. A through hole 150a is formed at an approximate center of the second annular body 150, and the drive shaft 124 is rotatably inserted at the through hole 150a with airtightness. The second annular body 150 is provided at an upper portion of the drive shaft 124, i.e., near the position at which the drive shaft 124 and the stage 122 are connected with each other.

A distended portion 150b is formed at the second annular body 150 so as to enclose the drive shaft 124. A projecting portion 150c, which corresponds to a groove 152a formed around the first annular body 152 secured to the drive shaft 124, is formed at the inner wall of the distended portion 150b. Thus, a mate/female fit is achieved by the groove 152a at the first annular body 152 secured to the drive shaft 124 and the projecting portion 150c at the second annular body 150. A bearing 154 is provided between the groove 152a and the projecting portion 150c to enable smooth rotation of the drive shaft 124. It is to be noted that modifications may be made in design as to at which member the male portion (the projecting portion) or the female portion (groove) should be formed, as long as a male/female fit is achieved by the first annular body 152 and the second annular body 150.

The structure described above allows the bellows 148 (the second annular body 150) to move up/down as the drive shaft 124 (the first annular body 152) moves up/down by fitting the male portion (the projecting portion) at the female portion (the groove) and disallows any rotation of the bellows 148 (the second annular body 150) when the drive shaft 124 (the first annular body 152) engages in a rotational motion by causing the male portion (the projecting portion) to rotate and slide inside the female portion (the groove) and thus allowing the drive shaft 124 (the first annular body 152) alone to rotate. As a result, the bellows 148 does not rotate and any damage to the bellows 148 caused by twisting is prevented in the embodiment.

In addition, an O-ring 156 constituting a seal member in the embodiment is provided between the inner wall of the through hole 150a of the second annular body 150 and the drive shaft 124. The O-ring 156, which adopts a structure essentially identical to that of the O-ring 125 mentioned earlier, achieves complete contact with the drive shaft 124 and the inner wall of the through hole 150a with airtightness. A lubricant 157 is applied onto the contact surface of the drive shaft 124 where it comes in contact with the O-ring 156 to allow smooth rotation of the drive shaft 124.

By adopting this structure, it becomes possible to achieve an airtight separation of a space (hereafter referred to as a "bellows internal space") 158 enclosed by the bellows 148, the second annular body 150 and the bottom 104c of the first cassette chamber 104 from the space within the first vacuum cassette chamber 104. Thus, any leakage of contaminants occurring at the bearings or the like provided between the drive shaft 124 and the first and second annular bodies 152 and 150 to the outside, for instance, can be prevented. In addition, since the size of the area of the drive shaft 124 having applied thereupon the lubricant 127 that is exposed inside the first vacuum cassette chamber 104 is minimized, the extent of the contamination attributable to the lubricant 127, too, can be minimized.

A vacuum pump 160 is connected via a valve 162a to the first vacuum cassette chamber 104 to evacuate the inner space of the first vacuum cassette chamber 104, and to adjust the pressure within the first vacuum cassette chamber 104. The vacuum pump 160 is also connected to the bellows internal space 158 via a valve 162b to adjust the pressure in the bellows internal space 158 as well.

When evacuation is performed by opening both the valve 162a and the valve 162b, the pressure inside the first vacuum cassette chamber 104 and the pressure in the bellows internal space 158 can be adjusted to levels substantially equal to each other, which prevents damage to the bellows such as a dent caused by the load attributable to the difference between the pressures within and outside the bellows 148 and applied onto the bellows.

It is to be noted that while a single vacuum pump is used to adjust the pressure levels in the space within the first vacuum cassette chamber 104 and in the bellows internal space 158 in the example presented in the figure, means for pressure adjustment such as vacuum pumps may be individually provided to adjust the pressure in each space instead.

Although not shown, a means for supplying the inert gas into the first vacuum cassette chamber 104 and a means for supplying an inert gas into the bellows internal space 158 are provided in order to raise the pressure inside the first vacuum cassette chamber 104 to a level essentially equal to the level of the atmospheric pressure. By implementing open/close control on valves provided in the individual inert gas supply paths, it becomes possible to adjust the pressures inside the first vacuum cassette chamber 104 and the bellows internal space 158 to levels essentially equal to each other. In addition, either the O-ring 125 or the O-ring 156 or both the O-ring 125 and the O-ring 156 function(s) as a seal member that airtightly seals the space inside the first vacuum cassette chamber 104 from the outside, depending upon the method adopted for evacuating the bellows internal space 158 and the method adopted for supplying the inert gas. For instance, if evacuation is performed by opening the valves 162a and 162b at the same time, the O-ring 125 functions as a seal member that airtightly seals the space within the first vacuum cassette chamber 104 from the outside and the O-ring 156 functions as a seal member that prevents the lubricant 127 and particles from entering the first vacuum cassette chamber 104. If evacuation is performed separately for the first vacuum cassette chamber 104 and the bellows internal space 158, on the other hand, the O-ring 156 functions as a seal member that seals the space within the first vacuum cassette chamber 104 from the outside with airtightness and also as a seal member that prevents the lubricant 127 and particles from entering the first vacuum cassette chamber 104.

(Second Embodiment)

Figure 3:
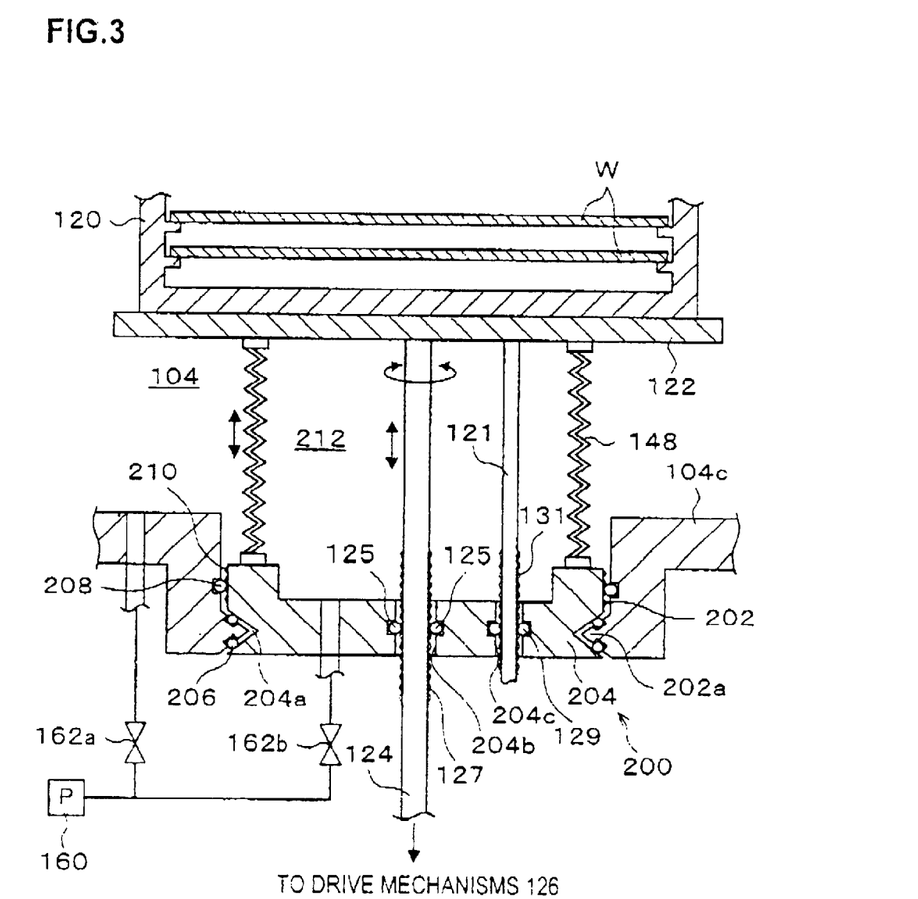
FIG. 3 is a schema tic sectional view of another seal mechanism that may be employed in the present invention to seal a vacuum cassette chamber.

Next, in reference to FIG. 3, the second embodiment of the present invention is explained. It is to be noted that the same reference numerals are assigned to components achieving functions and structural features identical to those in the processing device 100 explained earlier to preclude the necessity for a repeated explanation thereof.

This embodiment is characterized in that the bellows 148 constituting a seal mechanism 200 engages in rotational motion as well as vertical motion through connection with the drive shaft 124 and the stage 122. The following is an explanation of the structure assumed in the seal mechanism 200 in the embodiment.

An opening 202 is formed at the bottom 104c of the first vacuum cassette chamber 104. A rotating body 204 is rotatably fitted inside the opening 202. Thus, the rotating body 204 constitutes a wall of the bottom 104c of the first vacuum cassette chamber 104. A groove 204a is formed at the side of the rotating body 204. This groove 204a interlocks with a projecting portion 202a formed at the inner wall of the opening 202 to achieve a male/female fit. Between the groove 204a and the projecting portion 202a, a bearing 206 is provided so as to allow smoother rotational motion of the rotating body 204. In this structure, the rotating body 204 is rotatably supported at the bottom 104c. It is to be noted that modifications may be made in design as to at which member the male portion (the projecting portion) or the female portion (the groove) should be formed as long as the rotating body 204 and the opening 202 to achieve a male/female fit.

An O-ring 208 constituting a seal member in the embodiment is provided between the rotating body 204 and the opening 202. By adopting such a structure, it is possible to airtightly seal the space inside the first vacuum cassette chamber 104 without hindering the rotation of the rotating body 204. In addition, a lubricant 210 is applied onto the contact surfaces of the rotating body 204 where the rotating body 204 comes in contact with the O-ring 208 and the bearing 206. Thus, it is ensured that the rotating body 204 is allowed to rotate smoothly. At the same time, since the rotating body 204 does not move up/down as explained later, the lubricant 210 is not exposed into the first vacuum cassette chamber 104 thus avoiding contamination.

A through hole 204b is formed at an approximate center of the rotating body 204. The drive shaft 124 is inserted at the through hole 204b. The drive shaft 124 connects the stage 122 provided inside the first vacuum cassette chamber 104 to the external drive mechanism 126. An O-ring 125 constituting a seal member in the embodiment is provided between the inner wall of the through hole 204b and the drive shaft 124. In addition, a lubricant 127 is applied to the contact surface of the drive shaft 124 where it comes in contact with the O-ring 125. Thus, a bellows internal space 212, which is to be described in detail later, is airtightly sealed without hindering the rotation and the vertical motion of the drive shaft 124.

An auxiliary rod 121 is mounted at the stage 122 at a position offset relative to the position of the drive shaft 124. The auxiliary rod 121, which passes through a through hole 204c formed at the rotating body 204 is capable of supporting the rotating body 204 while rotating in response to the rotational motion of the stage 122. An O-ring 129 constituting a seal member in the embodiment is provided between the inner wall of the through hole 204c and the auxiliary rod 121. A lubricant 131 is applied onto the contact surface of the auxiliary rod 121 where it comes in contact with the O-ring 129. Thus, the bellows internal space 212 is airtightly sealed without hindering the rotation and the vertical motion of the drive shaft 124.

The drive shaft 124 is enclosed by the bellows 148 achieved in the embodiment. The two ends of the bellows 148 are respectively airtightly connected to the stage 122 and the rotating body 204. In this structure, the bellows internal space 212 enclosed by the rotating body 204, the bellows 148 and the stage 122 is isolated from the space inside the first vacuum cassette chamber 104 with airtightness. Furthermore, the levels of the pressure in the bellows internal space 212 and the pressure within the first vacuum cassette chamber 104 can be adjusted to levels approximately equal to each other by the vacuum pump 160. It is to be noted that since other structural features are identical to those achieved in the processing device 100 explained earlier, their detailed explanation is omitted.

In the embodiment adopting the structure described above, the stage 122 rotates as the drive shaft 124 is caused to rotate by the drive mechanism 126, and the rotating body 204, too, is also caused to rotate by the auxiliary rod 121 in response to the rotation of the stage 122, which, in turn, allows the bellows 148 to rotate as well through connection with the rotating body 204. In addition, when the drive shaft 124 is caused to move up/down by the drive mechanism 126, the stage 122, the bellows 148, and the auxiliary rod 121 travel up/down in response to the vertical motion of the drive shaft 124.

As explained above, in the embodiment, in which the stage 122 and the bellows 148 are allowed to rotate and move up/down as one body, the bellows 148 can be connected to the stage 122 to enclose the entire periphery of the drive shaft 124 extending inside the first vacuum cassette chamber 104. As a result, any leakage of contaminants caused by the movement of the drive shaft 124 into the first vacuum cassette chamber 104 is prevented. Furthermore, the first vacuum cassette chamber 104 is not adversely affected by the lubricants 127 and 131 applied onto the drive shaft 124.

In addition, either the O-ring 208 or the O-ring 125 (129) or both the O-ring 208 and the O-ring 125 (129) function(s) as a seal member that seals the space inside the first vacuum cassette chamber 104 from the outside depending upon the method adopted for evacuating the bellows internal space 212 and the method adopted for supplying the inert gas.

In addition, if a ball-spline mechanism is adopted at the drive shaft 124 to rotate the rotating body 204 and the drive shaft 124 as one body, it becomes unnecessary to provide the auxiliary rod 121. It is to be noted that in this case, a seal mechanism is provided in order to vacuum seal the ball-spline mechanism.

While the invention has been particularly shown and described with respect to preferred embodiments thereof by referring to the attached drawings, the present invention is not limited to these examples and it will be understood bib those skilled in the art that various changes in form and detail may be made therein without departing from the spirit, scope and teaching of the invention.

For instance, while an explanation is given above in reference to the embodiments on an example in which the seal mechanism is adopted in conjunction the drive mechanism employed to drive the stage in a vacuum cassette chamber, the present invention is not limited to these structural particulars. For instance, the present invention may be adopted in a drive mechanism for driving the stage at a workpiece positioning device (orienter) provided inside the vacuum transfer chamber, instead.

INDUSTRIAL APPLICABILITY

The present invention may be adopted in a vacuum processing device having a driven body provided inside a vacuum processing chamber, a driving means provided outside the vacuum processing chamber and a drive shaft connecting the driven body and the driving means to transmit a drive force of the driving means to the driven body and, more specifically, it may be adopted in the process of manufacturing semiconductor devices, LCD substrates and the like.

(Explanation of Reference Numerals)
100 processing device
102 vacuum transfer chamber
104, 106 first and second vacuum cassette chambers
109, 110, 112, 114 vacuum processing chamber
116 transfer arm
118 orienter
120 cassette
122 stage
124 drive shaft
125, 129, 156, 208 O-ring
126 drive mechanism
127, 131, 157, 210 lubricant
146, 200 seal mechanism
148 bellows
150 second annular body
152 first annular body
154 bearing
158 bellows internal space
160 vacuum pump
204 rotating body
W wafer

What is claimed is:

1. A vacuum device comprising:
   a driven body provided within a vacuum chamber;
   a driving means provided outside said vacuum chamber, which rotates and moves up/down said driven body; and
   a drive shaft connecting said driven body to said driving means to transmit a drive force of said driving means to said driven body, further comprising:
   a first annular body secured to said drive shaft inside said vacuum chamber, which rotates around an axial center thereof;
   a second annular body rotatably supported by said first annular body and moving up/down with said first annular body as one body;
   a bellows capable of expanding/contracting, which is provided within said vacuum chamber so as to airtightly seal the periphery of said drive shaft, with one end thereof secured to said second annular body and with another end thereof secured to an inner wall of said vacuum chamber; and
   a first seal member provided between said drive shaft and said second annular body.

2. A vacuum device according to claim 1, wherein said vacuum chamber is a vacuum cassette chamber and said driven body is a stage on which a cassette inside said vacuum cassette chamber is placed.

3. A vacuum device according to claim 1, wherein said drive shaft airtightly passes through an inner wall of said vacuum chamber via a second seal member that allows movement of said drive shaft.

4. A vacuum device according to claim 1, further comprising a means for pressure adjustment that adjusts the pressure in the space airtightly sealed by said bellows so as to sustain levels of the pressure in the space airtightly sealed by said bellows and the pressure inside said vacuum chamber substantially equal to each other.

5. A vacuum device comprising:
   a driven body provided within a vacuum chamber;
   a driving means provided outside said vacuum chamber; and
   a drive shaft connecting said driven body to said driving means to transmit a drive force of said driving means to said driven body, further comprising:
   a rotating body, through which said drive shaft passes, rotatably supported at an opening formed at a wall of said vacuum chamber; and
   a bellows that connects said driven body to said rotating body so as to airtightly seal the periphery of said drive shaft and is allowed to expand/contract freely as said drive shaft moves up/down and rotates around said drive shaft together with said driven body and said rotating body.

6. A vacuum device according to claim 5, wherein said rotating body is airtightly supported at said opening via a first seal member that allows rotation of said rotating body.

7. A vacuum device according to claim 5, wherein said rotating body airtightly encloses said drive shaft via a second seal member that allows movement of said drive shaft.

8. A vacuum device according to claim 5, wherein an auxiliary shaft that passes through said rotating body and supports said rotating body while rotating in response to rotation of said driven body is provided at a position offset from said drive shaft.

9. A vacuum device according to claim 8, wherein said auxiliary shaft airtightly passes through said rotating body via a third seal member that allows movement of said auxiliary shift.

10. A vacuum device according to claim 5, further comprising a means for pressure adjustment that adjusts the pressure in the space airtightly sealed by said bellows so as to sustain levels of the pressure in the space airtightly sealed by said bellows and the pressure in said vacuum chamber substantially equal to each other.

* * * * *

UNITED STATES PATENT AND TRADEMARK OFFICE
CERTIFICATE OF CORRECTION

PATENT NO.    : 6,932,885 B1
DATED         : August 23, 2005
INVENTOR(S)   : Hiroki Oka It is certified that error appears in the above-identified patent and that said Letters Patent is hereby corrected as shown below:

Column 12,
Line 49, "shift." should read -- shaft. --.

Signed and Sealed this

First Day of November, 2005

JON W. DUDAS
*Director of the United States Patent and Trademark Office*